United States Patent
Woo et al.

(10) Patent No.: US 7,650,687 B2
(45) Date of Patent: Jan. 26, 2010

(54) DIE ATTACHING APPARATUS

(75) Inventors: Jung-Hwan Woo, Chungcheongnam-do (KR); Ho-Jae Byon, Gyeonggi-do (KR); Jae-Bong Shin, Seoul (KR); Yong-Kyun Sun, Chungcheongnam-do (KR); Hyun-Ho Kim, Chungcheongnam-do (KR); Choo-Ho Kim, Gyeonggi-do (KR); Youn-Sung Ko, Chungcheongnam-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 589 days.

(21) Appl. No.: 11/155,181

(22) Filed: Jun. 16, 2005

(65) Prior Publication Data
US 2006/0048381 A1 Mar. 9, 2006

(30) Foreign Application Priority Data
Sep. 3, 2004 (KR) .................... 10-2004-0070235

(51) Int. Cl.
*B23P 19/00* (2006.01)
*B21F 1/00* (2006.01)

(52) U.S. Cl. ............................ 29/740; 29/742; 29/754; 29/739; 29/729; 29/832; 140/105

(58) Field of Classification Search ................... 29/740, 29/742, 743, 755, 760, 757, 739, 729, 832, 29/720, 721; 264/570, 571, 572, 566; 83/123; 72/354.2, 355.4, 532; 347/171; 438/106, 438/123; 257/754, 676, 782; 140/105, 154
See application file for complete search history.

(56) References Cited

U.S. PATENT DOCUMENTS

| 4,507,861 | A | * | 4/1985 | Sprenkle | .................... 29/741 |
| 4,599,253 | A | * | 7/1986 | Bree | .................... 428/40.9 |
| 4,999,909 | A | * | 3/1991 | Eguchi et al. | ................. 29/740 |
| 5,054,353 | A | * | 10/1991 | Haack et al. | ............... 83/639.5 |
| 5,558,015 | A | * | 9/1996 | Miyashita et al. | ............. 100/50 |
| 5,729,272 | A | * | 3/1998 | Kikuchi | ..................... 347/171 |
| 5,870,820 | A | * | 2/1999 | Arakawa et al. | .............. 29/740 |
| 6,030,576 | A | * | 2/2000 | Cassani | ..................... 264/570 |
| 6,142,356 | A | * | 11/2000 | Yamazaki et al. | ............ 228/6.2 |
| 6,214,706 | B1 | * | 4/2001 | Madan et al. | ............... 438/482 |

(Continued)

FOREIGN PATENT DOCUMENTS

JP 03181326 * 8/1991

(Continued)

OTHER PUBLICATIONS

English language abstract of Korean Publication No. 2001-0055843.

(Continued)

*Primary Examiner*—Minh Trinh
*Assistant Examiner*—Tai Nguyen
(74) *Attorney, Agent, or Firm*—Volentine & Whitt, PLLC

(57) ABSTRACT

Provided are a die attaching apparatus, a cleaning system and a method having components which can be easily replaced with new ones adapted to various packages within a short period of time. Surfaces of a die pressing member and a heat plate are prevented from being contaminated. The die pressing member is detachably attached to a lower end of an attaching unit which may directly apply a pressure to dies. A heat plate grinder on which a grinding apparatus for grinding the heat plate is mounted is spaced a predetermined distance from the die pressing member. A heat plate cleaner is attached to a side wall of the heat plate grinder and removes residues remaining on the heat plate.

14 Claims, 9 Drawing Sheets

U.S. PATENT DOCUMENTS 6,784,657 B2 * 8/2004 Fujishiro et al. ......... 324/158.1

FOREIGN PATENT DOCUMENTS

| JP | 08-162587 | * | 6/1996 |
| JP | 11-145161 | | 5/1999 |
| KR | 2001-0055843 | | 7/2001 |
| KR | 2002-0039571 | | 5/2002 |

OTHER PUBLICATIONS

English language abstract of Korean Publication No. 2002-0039571.
English language abstract of Japanese Publication No. 11-145161.

* cited by examiner

DIE ATTACHING APPARATUS

BACKGROUND OF THE INVENTION

This application claims the priority of Korean Patent Application No. 10-2004-0070235, filed on Sep. 3, 2004 in the Korean Intellectual Property Office, the disclosure of which is incorporated herein in its entirety by reference.

1. Field of the Invention

The present invention relates to an apparatus and method for manufacturing a semiconductor package, and more particularly, to a die attaching apparatus, and a system and method for cleaning the die attaching apparatus.

2. Description of the Related Art

Chips produced in the form of a wafer are packaged such that they are protected from external shocks and properly mounted on a board. A process of bonding the chips on a substrate during a package manufacturing process is called a die attaching process. Specifically, dies individualized through a sawing process are attached onto a substrate, such as a lead frame, by means of an adhesive, such as an epoxy tape.

Referring to FIG. 1, the die attaching apparatus includes a press unit 20, which generates a pressure, and an attaching unit 30, which attaches dies 16 to a substrate 14 using the pressure. The attaching unit 30, which is a single unit comprising a plurality of parts, operates at a pressure. The press unit 20 receives an external pressure and causes a hydraulic pressure generating unit 36 to generate a hydraulic pressure. Since the hydraulic pressure is isotropic, a uniform pressure is generated in all directions. Here, the hydraulic pressure is measured by a hydraulic pressure sensing unit 32.

The hydraulic pressure is transferred downward to lower a plurality of plungers 42. The lowered plungers 42 apply the pressure to the dies 16 located on the substrate 14. Cylindrical collets (not shown) may protrude from lower ends of the plungers 42 directly contacting the dies 14. Here, the distance between adjacent plungers 42 is adjusted by a distance between adjacent plunger guides of a plurality of plunger guides 48. A heater 46 for heating the plungers 42, and support bodies 44 may be disposed on a lower side of the unit 30 near the plungers 42. After a die attaching process ends, the press unit 20 is lifted and the plungers 42 and the hydraulic pressure generating unit 36 are returned to their own positions using springs 38. Reference numeral 34 denotes a main block.

Here, since the attaching unit 30 is a single unit, an entire attaching unit 30 is demounted or mounted when components need to be replaced. If the type of a package is changed, the size of the plungers 42 and the distance between the plungers 42 are changed. The distance between the plungers 42 can be adjusted by replacing the plunger guides 48. However, in order to replace the plunger guides 48, the whole attaching unit 30 should be demounted and removed and then a new attaching unit 30 should be mounted in its place because the attaching unit 30 including the plunger guides 48 is a single unit. Accordingly, repair/replacement costs are high and all processes involving the attaching unit 30 must be stopped while the new attaching unit 30 is installed.

In the meantime, the substrate 14, which is a stripe-shaped, for example, in the form of a lead frame, is placed on a heat plate 12 that is formed on a worktable 10, and the dies 16 are mounted on the substrate 14. On the dies 16 and the substrate 14 supplied for the die attaching process, there are formed micro circuits and wire bonding pads. Since the collet and the heat plate 12 may be contaminated by foreign substances residing in the circuits and the pads during the die attaching process, the surface of the collet and the heat plate 12 should be periodically cleaned. However, a conventional cleaning process, which is manually or automatically performed, does not achieve satisfactory cleaning results. Accordingly, there is a demand for developing a new cleaning system and method, which can achieve more improved cleaning results and prevent secondary pollution caused by dust produced during a cleaning process.

SUMMARY OF THE INVENTION

The present invention provides a die attaching apparatus, which allows components to be easily replaced with new ones adapted to various packages within a short period of time.

The present invention also provides a cleaning system, which can prevent surfaces of a die pressing member and a heat plate of the die attaching apparatus from being contaminated.

The present invention also provides a cleaning method, which can prevent surfaces of a die pressing member and a heat plate of the die attaching apparatus from being contaminated.

More specifically, the die attaching apparatus of the present invention comprises a press unit for generating a pressure to attach a plurality of dies to a substrate. At least one attaching unit is disposed under the press unit for transferring the pressure in a substantially downward direction. A die pressing member is detachably attached to a lower end of the attaching unit for applying the pressure to the dies. Preferably, the press unit comprises an upper press, which receives an external pressure, and a lower press, which transfers the pressure to the attaching unit. The die attaching apparatus of this invention can further comprise a load cell and a spring disposed between the upper press and the lower press such that the load cell measures the pressure applied to the dies and the spring provides a force for controlling the pressure applied to the dies. Preferably, the spring and the lower press are fixed by a floating joint that absorbs the vibration of the spring relative to a central axis of the die attaching apparatus.

The die attaching apparatus can further comprise a member for limiting, and preferably preventing, the rotation of the attaching unit and/or a bushing fitted around the attaching unit and/or a guide block joined to the press unit for guiding the movement of the attaching unit and/or an automatic transfer unit disposed over the press unit for horizontally moving the die attaching apparatus.

The die attaching apparatus can also comprise a heater disposed adjacent to the attaching unit for heating the die pressing member. Preferably, a heat-insulating block is attached onto the heater and prevents heat generated by the heater from being transferred upward. Moreover, wherein a hole passing through the heater has a diameter large enough to accommodate a package of the largest size for performing a die attaching process.

The die attaching apparatus can also include a die pressing member supporting member for attaching the die pressing member to the attaching unit. The die pressing member is preferably affixed to a side wall of the die pressing member supporting member and/or has at least one projection protruding therefrom toward the dies. Preferably, the projection is configured to cover the plurality of dies. The die pressing member is preferably made of a high conductivity material such as silica.

A system is also provided for cleaning a die attaching apparatus. The system comprises a die pressing member detachably connected to a lower end of a attaching unit and applying a pressure to dies; a heat plate grinder spaced a predetermined distance from the die pressing member including a grinding apparatus for grinding a heat plate; and a heat plate cleaner attached to a side wall of the heat plate grinder for removing residues remaining on the heat plate. Preferably, wherein the grinding apparatus is a grinding wheel. The system can further comprises an air blower forming an air flow passage inside the heat plate cleaner for collecting the residues and/or a die pressing member cleaner disposed under the die pressing member for removing residues remaining on a surface of the die pressing member.

A method of cleaning a die attaching apparatus is also provided. The method comprises simultaneously moving a die pressing member and a heat plate grinder using an automatic transfer unit such that the die pressing member is positioned over a die pressing member cleaner and a heat plate is positioned under the heat plate grinder, and sequentially or simultaneously cleaning the die pressing member and the heat plate. The cleaning of the die pressing member can comprise attaching the die pressing member to a cleaning apparatus of the die pressing member cleaner, and removing residues remaining on a lower end portion of the die pressing member by moving the die pressing member cleaner across the die pressing member. The method of cleaning of the heat plate can comprise attaching the heat plate grinder to a top surface of the heat plate, grinding the heat plate by moving the heat plate grinder across the heat plate, moving the heat cleaner over the heat plate, removing residues remaining on the heat plate using a cleaning apparatus, and collecting the removed residues through an air flow passage formed inside the heat plate cleaner using a vacuum.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

The present invention will now be described more fully with reference to the accompanying drawings, in which preferred embodiments of the invention are shown.

Figure 1:
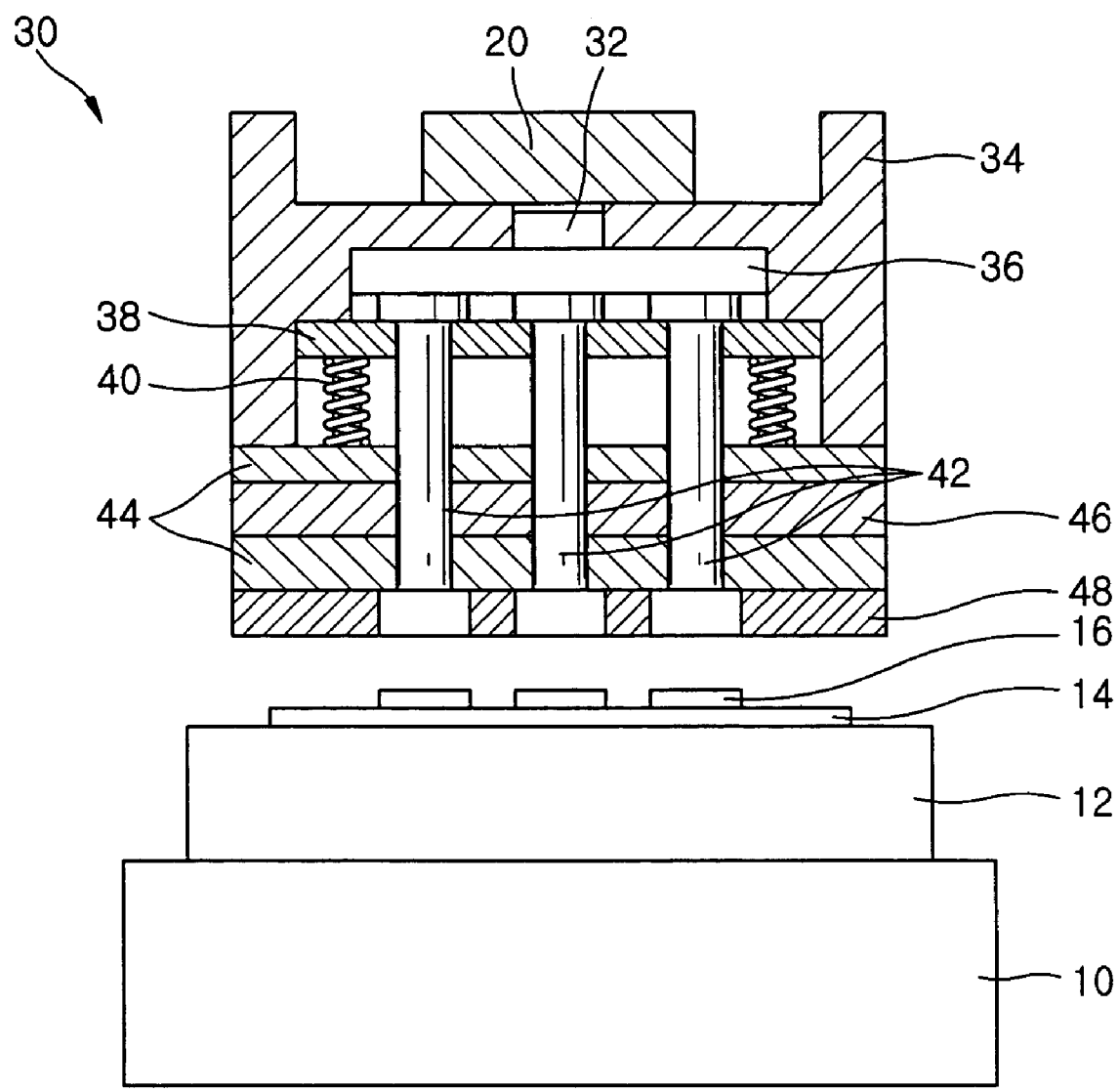
FIG. 1 is a schematic cross-sectional view of a conventional prior art die attaching apparatus.
Figure 2:
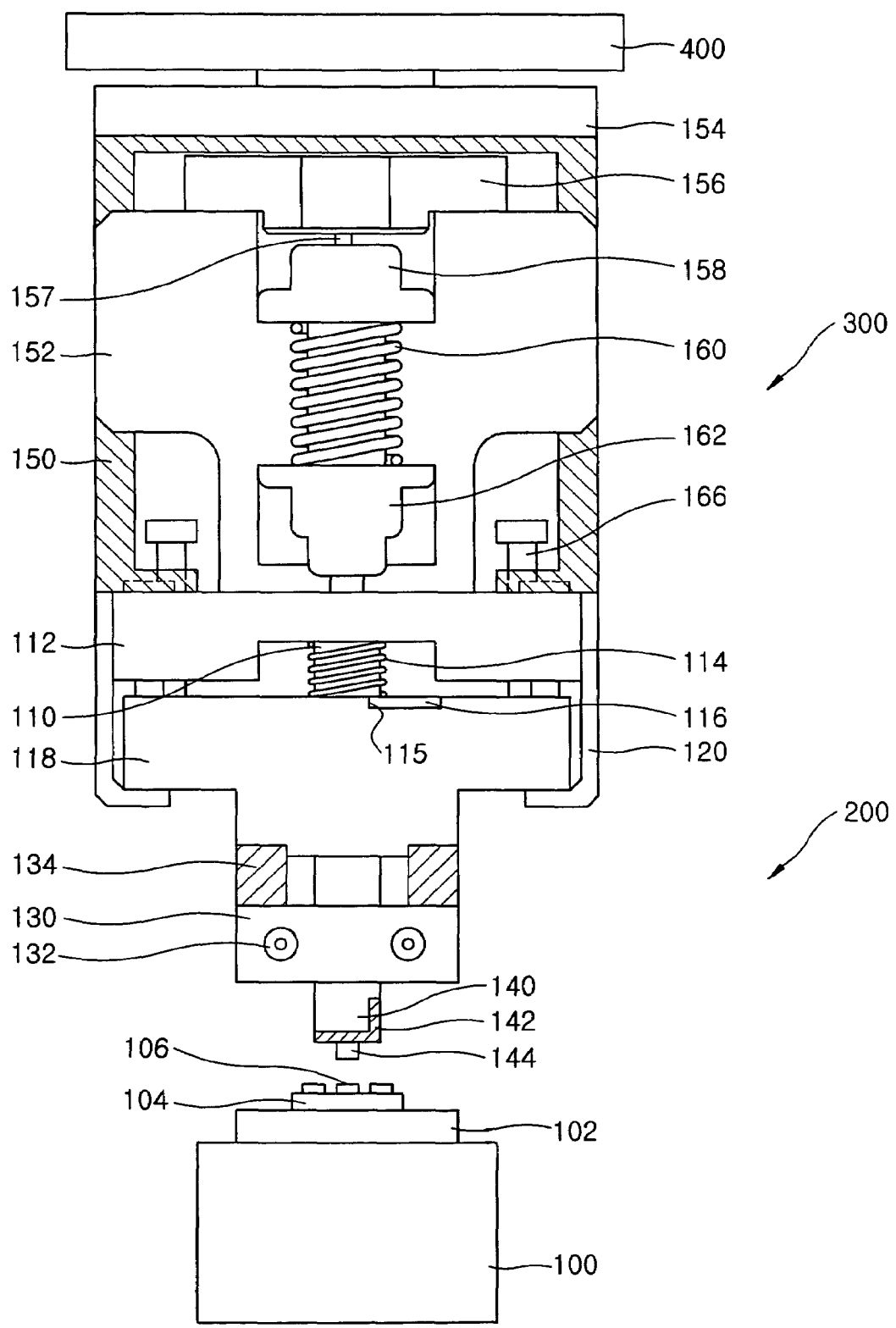
FIG. 2 is a schematic cross-sectional view of a die attaching apparatus according to an embodiment of the present invention.

Referring to FIG. 2, the die attaching apparatus includes a press unit 300, which generates a pressure used to attach dies 106, and an attaching unit 200, typically a plunger. The attaching unit 200 includes at least one plunger 110 that transfers the pressure downward from the press unit 300.

The press unit 300 includes an upper press 156 and a lower press 164 (see FIG. 5) inside a main block 150. The upper press 156 receives an external pressure and the lower press 164 preferably directly transfers the pressure to the plunger 110. A load cell 158 and a first elastic body 160, for example, a spring, may be mounted between the upper press 156 and the lower press 164 such that the load cell 158 measures the pressure applied to the dies 106. The first elastic body 160 provides a restoring force against the pressure. Here, the first elastic body 160 and the lower press 164 may be fixed by a floating joint 162 that absorbs the vibration from the first elastic body 160 relative to the central axis of the press unit 300.

The attaching unit 200 includes a die pressing member, such as a collet 142, which is detachably connected to a lower end of the plunger 110 and which may directly apply a pressure to the dies 106. Here, a groove 115 may be formed on one side surface of the plunger 110, and a plunger rotation limiting member 116 may be inserted into the groove 115 to prevent the rotation of the plunger 110. Here, the plunger 110 is supported by a plunger supporting member 112, and is joined within a guide block 118.

The guide block 118, which guides the movement of the plunger 110, may be affixed to the main block 150 by adjustment bolts 166. The adjustment bolts 166 can maintain the guide block 118 in a substantially horizontal position using forces created by applying a tension and a compressive force to the guide block 118. If the guide block 118 is horizontal, both a top surface of the plunger 110 and the bottom surface of the collet 142 are horizontally maintained as well. Further, since the press unit 300 for generating a pressure and the attaching unit 200 for transferring the pressure are integrally connected by adjustment bolts 166, the entire integrated press unit 300 and attaching unit 200 can be moved to a predetermined position by an automatic transfer unit 400.

A bushing made of the same material as the plunger 110 may be fitted around the plunger 110 so that the plunger 110 can smoothly reciprocate and sticking caused by a thermal deformation can be prevented. A heater 130 for heating the collet 142 may be disposed on a lower side near the plunger 110. The heater 130 may include a temperature sensor 132, which measures temperature, and a heat-insulating block 134, which is attached on the heater 130 and prevents the heat produced by the heater 130 from being transferred upward. If the application of pressure is terminated, the plunger 110 returns to its original position limited by a second elastic body 114, for example, a spring, which is disposed between the plunger supporting member 112 and the guide block 118.

The automatic transfer unit 400, which horizontally moves the die attaching apparatus, and a bonding head 154, which generates a pressure, is positioned over the press unit 300. The collet 142 includes a collet supporting member 140 and a plurality of projections 144, which will be explained in detail with reference to FIGS. 3 and 4.

Figure 3:
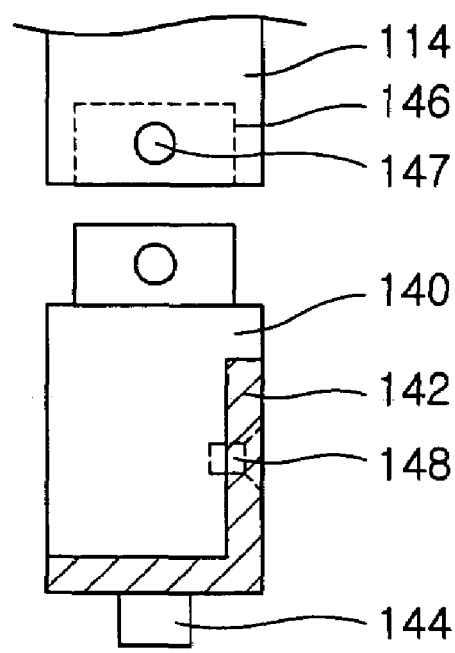
FIG. 3 is a partial sectional view of a collet attached to a plunger in the die attaching apparatus of FIG. 2.

Referring to FIGS. 2 and 3, the collet supporting member 140 may be disposed between the plunger 110 and the collet 142 to attach the collet 142 to the plunger 110. The collet supporting member 140 is inserted into an insertion hole 146 formed in the lower end of the plunger 110, and fixed to the plunger 110 by first fastening means 147, for example, a bolt. The collet 142 may be fixed to one side wall of the collet supporting member 140 by second fastening means 148, for example, a bolt.

Figure 4A:
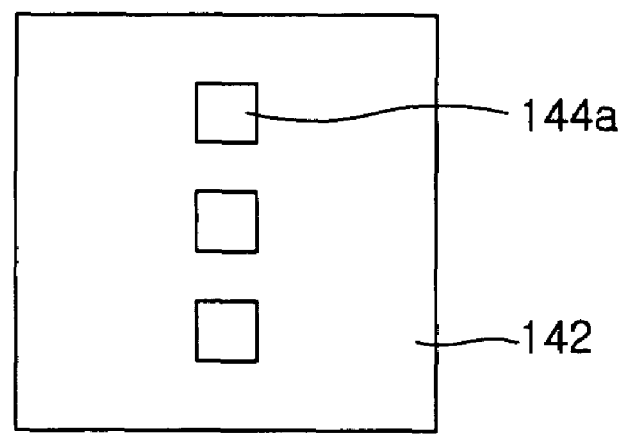
FIGS. 4A through 4C are bottom views of projections that may directly apply a pressure to dies in the die attaching apparatus shown in FIG. 2.
Figure 4B:
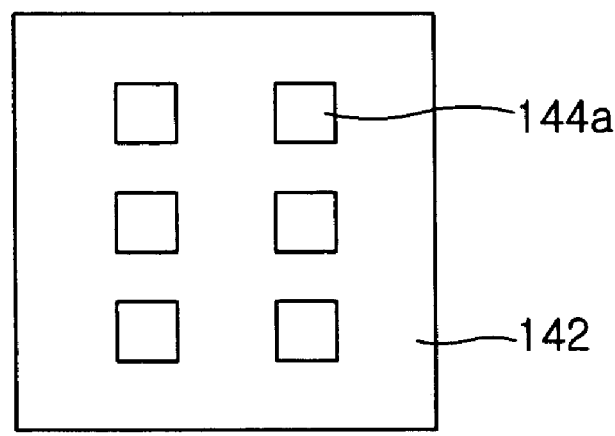
Figure 4C:
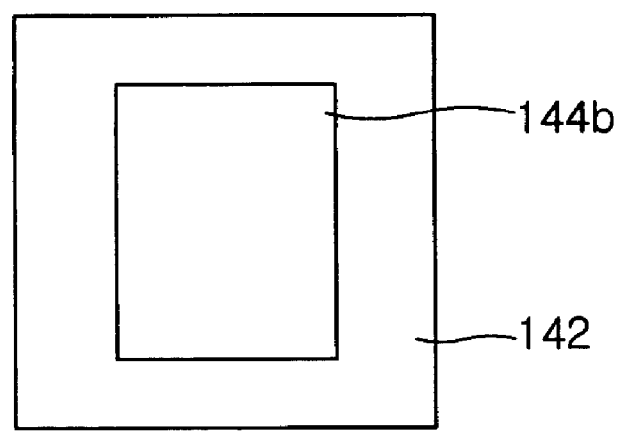

At least one projection 144 projects from the bottom surface of the collet 142 toward the dies 106. The projection 144 may be manufactured to have a shape, for example, a square pillar cross-sectional shape, corresponding to the square cross-sectional shape of the dies 106. One single projection 144 may be formed to apply a pressure to a single die 106, or a plurality of projections 144 may be formed to respectively apply a pressure to a plurality of dies 106 at the same time as shown in FIGS. 4A and 4B. Also, the projection 144 may be shaped to cover all the plurality of dies 106 as shown in FIG. 4C.

It is preferable that the collet 142 be made of a material having high heat conductivity, for example, silicon carbide (SiC) or silica ($SiO_2$), to uniformly distribute temperature. The heat-insulating block 134 may be made of material having high heat-insulating properties, for example, aluminum/titanium oxide ($Al_2TiO_5$). The plunger 110 may be made of alumina ($Al_2O_3$) having high heat-insulating properties and high stiffness.

Figure 5:
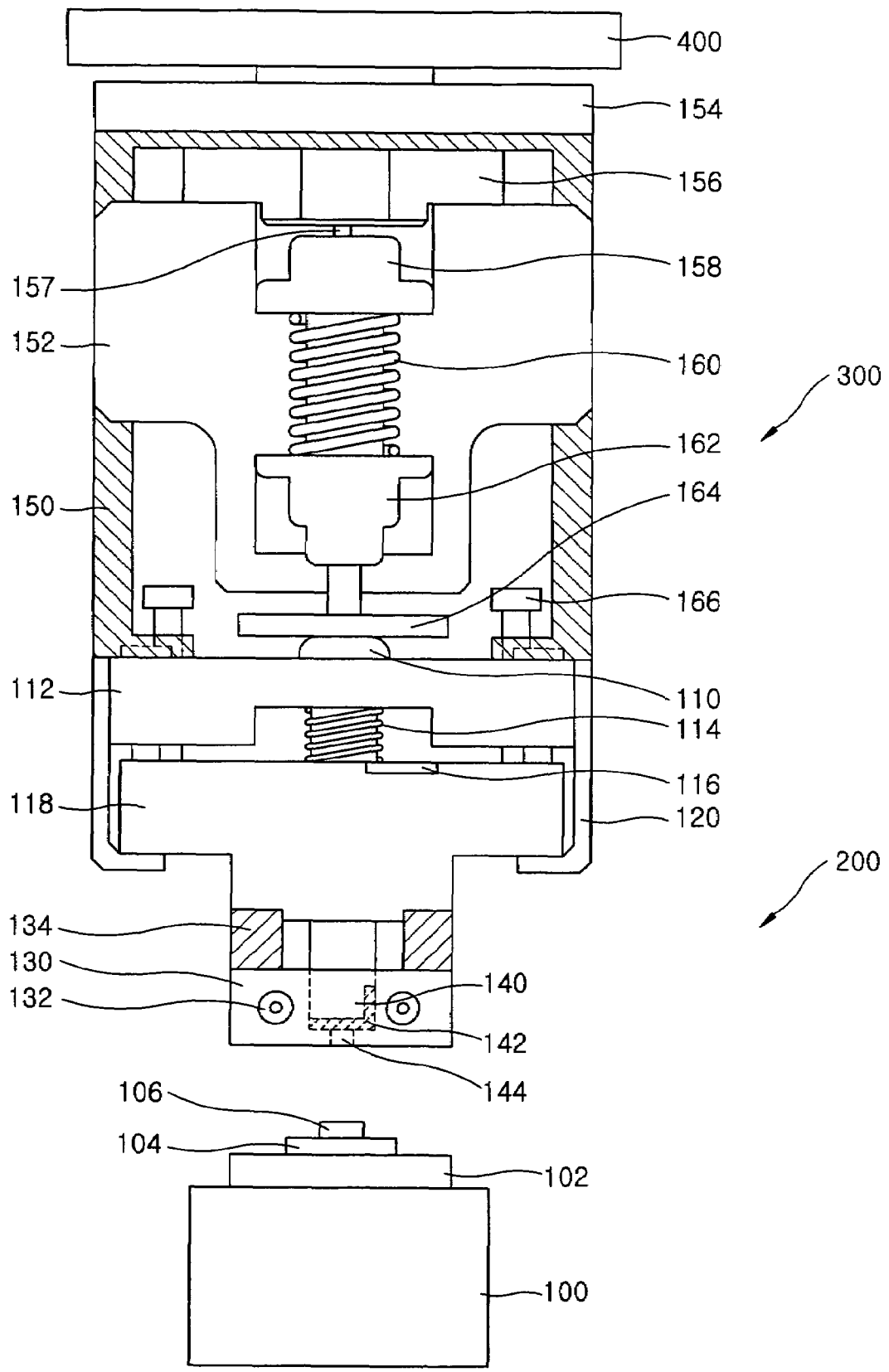
FIGS. 5 through 7 are schematic cross-sectional views of a die attaching process according to an embodiment of the present invention.
Figure 6:
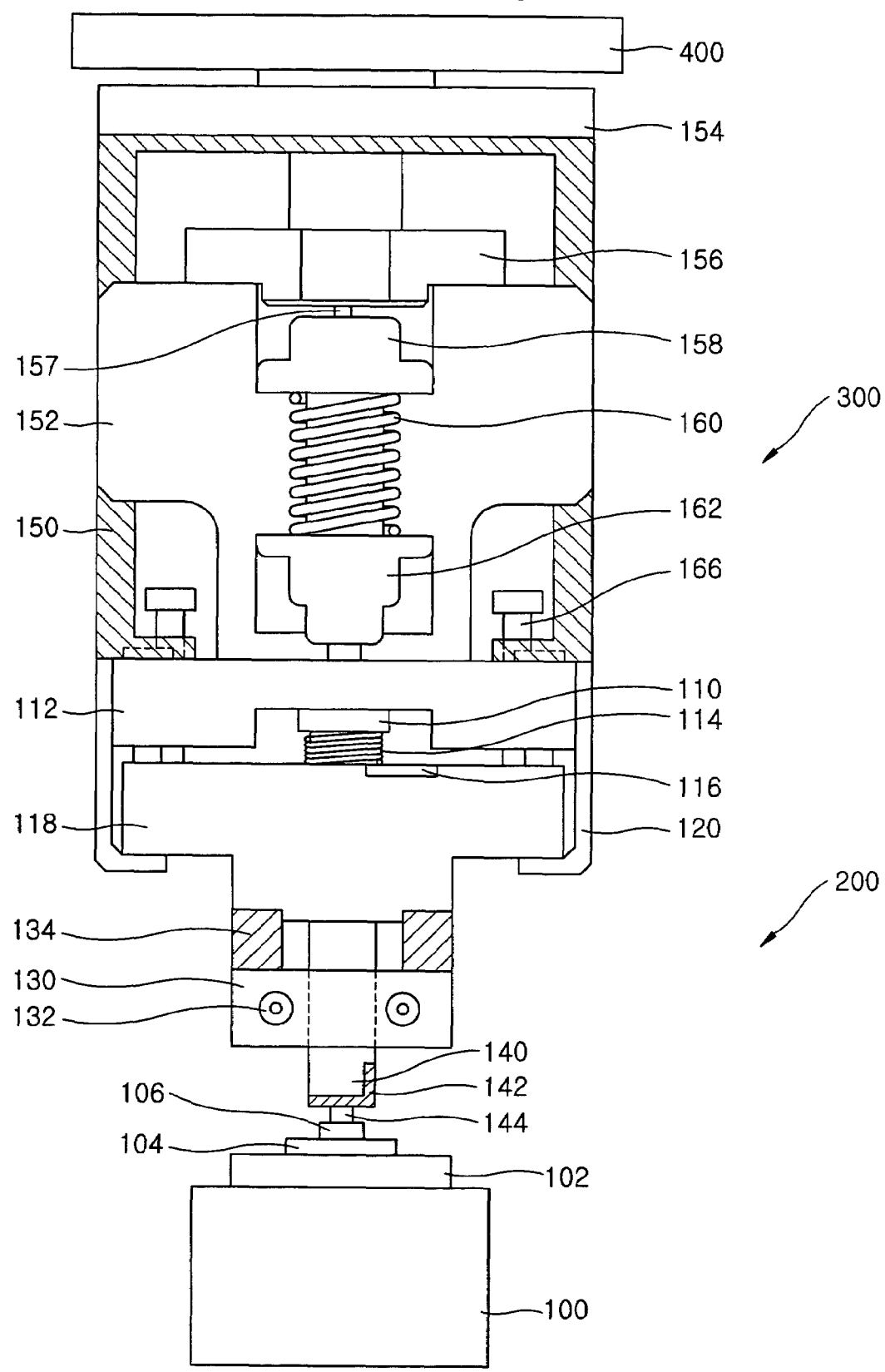
Figure 7:
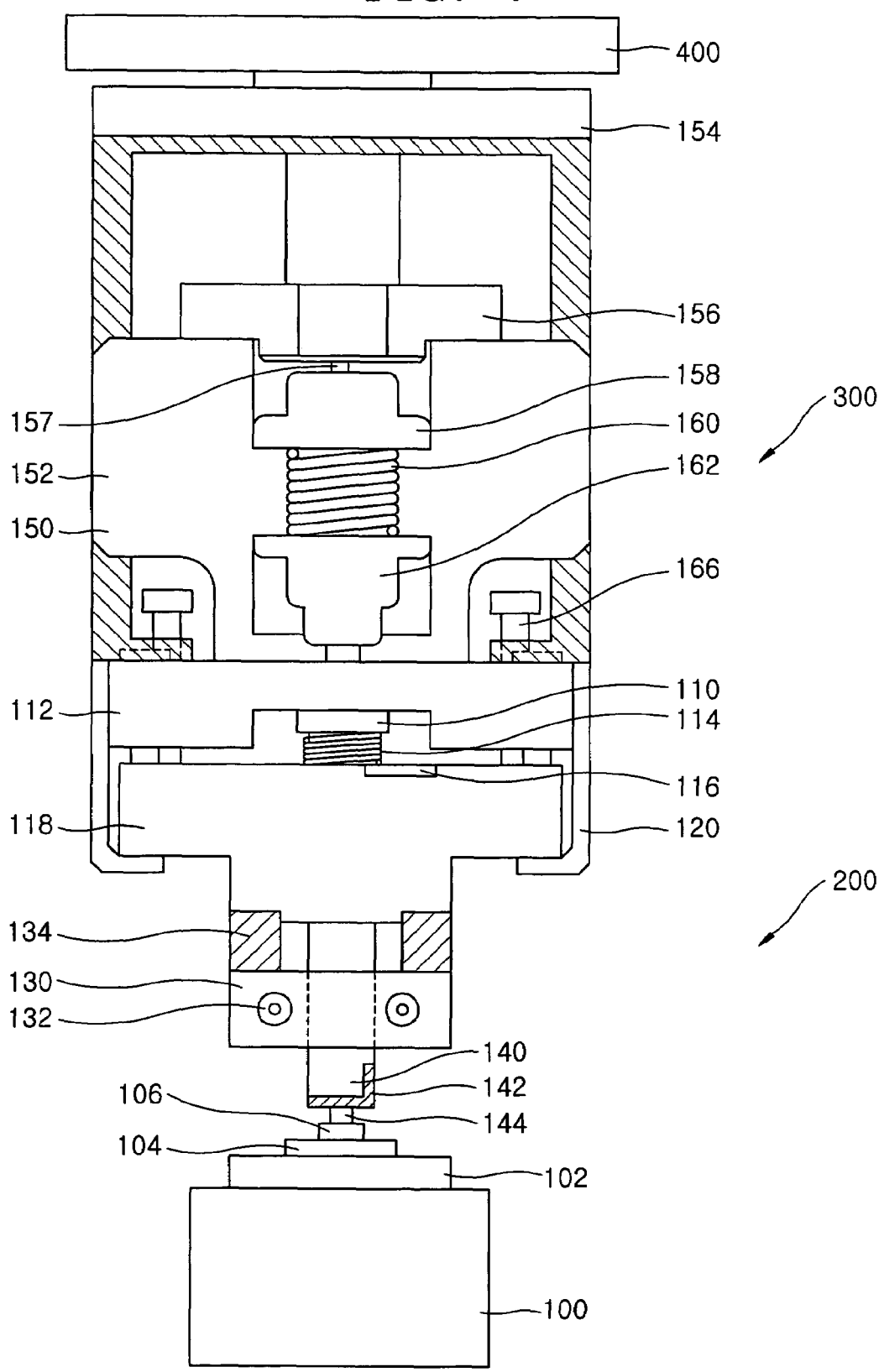

Referring to FIGS. 5 through 7, the press unit 300 for receiving a pressure generated by the bonding head 154 is lowered to contact the top surface of the plunger 110 (see FIG. 5). At this time, the press unit 300 engages the plunger 110 but the pressure is not transferred to the attaching unit 200 as yet. The collet 142 is located inside the heater 130. That is, the collet 142 is heated to a predetermined temperature by the heater 130.

If the pressure is applied to the plunger 110, the plunger 110 pushes the collet 142 to the outside of the heater 130 to attach the collet 142 to top surfaces of the dies 106 (see FIG. 6). If the pressure continues to be applied, a load cell head unit 157 mounted on the load cell 158 contacts the upper press 156 to measure the pressure.

If the press unit 300 is lowered until the pressure reaches a preset pressure, the first elastic body 160 will be compressed due to the compressive force. The compressive force will be transferred to the dies 106 such that the dies 106 contact the substrate 104. Here, since heat generated by the heater 130 is also applied, the dies 106 receive both the pressure and the heat at the same time. Thus, the displacement of the first elastic body 160 determines the force used to attach the dies 106. If the die attaching process is completed, the plunger 110 lowered by the press unit 300 returns to its original position due to the second elastic body 114.

According to the present embodiment, since the projections 144 of the collet 142 are shaped to press the plurality of dies 106, the die attaching apparatus can attach the plurality of dies 106 to the substrate 104 in a single pressing operation. Further, if the type of package is changed and the size of the dies 106 and/or the distance between the dies 106 are changed, only the collet 142 needs to be replaced with a new collet 142 suitable for pressing the changed die layout. A hole passing through the heater 130 in which the collet is located has a diameter large enough to accommodate the largest package layout in which the die attaching process is to be performed. Accordingly, if the type of package is changed, only the collet 142 is replaced without changing the heater 130.

According to the present embodiment, components can be easily replaced with new ones suitable for various packages within a short period of time. That is, only the collet 142 is replaced without replacing the whole conventional attaching apparatus. Consequently, component replacement time and costs can be minimized. Furthermore, the projections of the collet 142 can be manufactured to have various shapes almost without limitation according to the kinds of packages which are employed.

Figure 8:
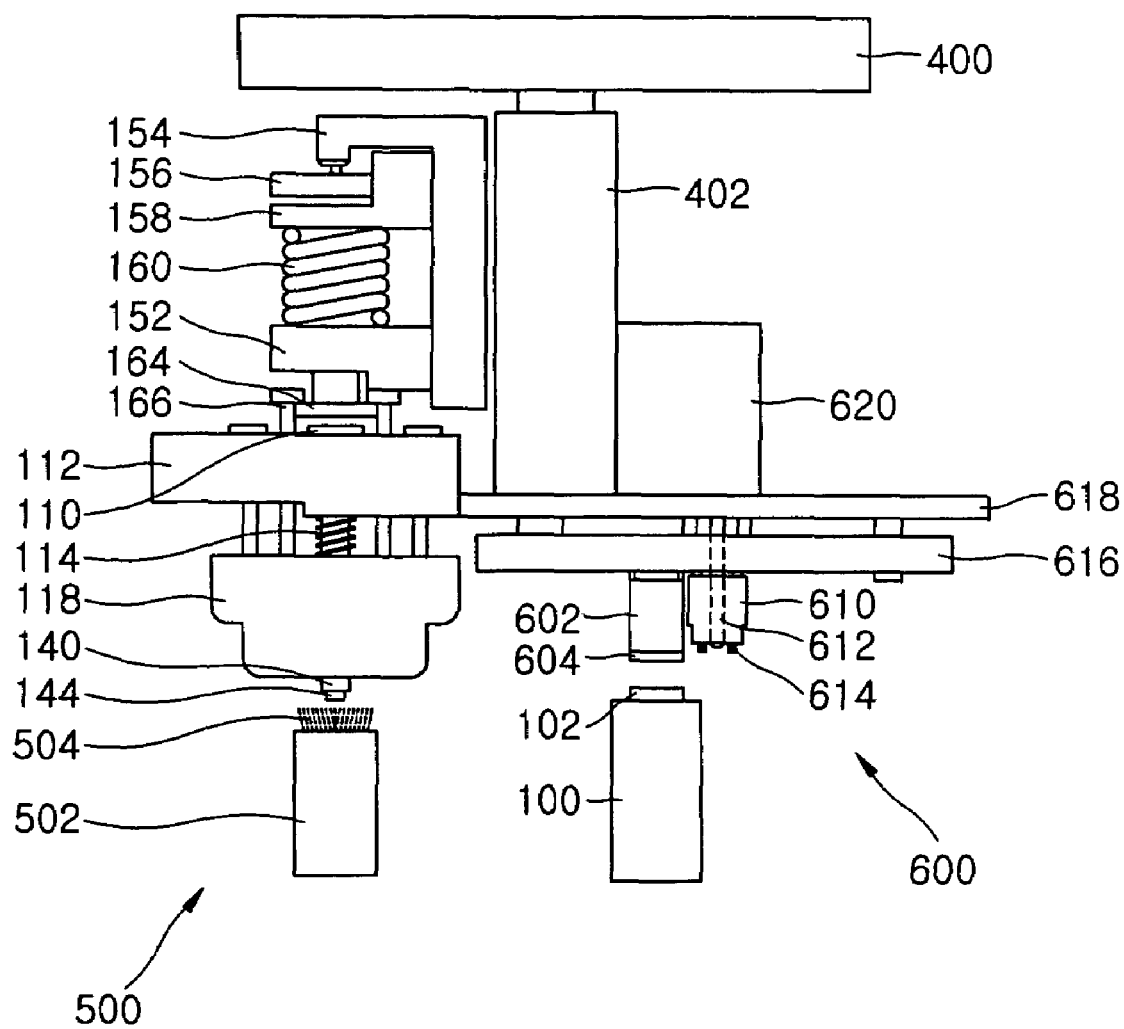
FIG. 8 is a schematic cross-sectional view of a cleaning system according to an embodiment of the present invention.

Referring to FIG. 8, the cleaning system includes a collet cleaner 500 and a heat plate cleaning unit 600. The collet cleaner 500 is disposed below the collet 142 and removes residues remaining on a surface of the collet 142 using cleaning apparatus 504, such as a brush.

The heat plate cleaning unit 600 is spaced a predetermined distance from the collet 142 of the die attaching apparatus. The heat plate cleaning unit 600 includes a heat plate grinder 602 on which heat plate grinding apparatus 604 is mounted, and a heat plate cleaner 610 attached to a side wall of the heat plate grinder 602 for removing residues on a heat plate 102. Here, the grinding apparatus 604 may be a grinding wheel. The heat plate cleaner 610 may include an air blower 612 that forms an air flow passage there inside and outwardly discharges residues.

The heat plate grinder 602 and the heat plate cleaner 610 are horizontally moved by the automatic transfer unit 400. The heat plate cleaning unit 600 is moved by a cylinder 620, which is mounted on a support plate 618 of the heat plate cleaning unit 600, and by the automatic transfer unit 400. That is, the heat plate cleaning unit 600 is vertically and horizontally moved by the cylinder 620, and is horizontally moved by the automatic transfer unit 400.

According to a cleaning method of an embodiment of the present invention, the collet 142 and the heat plate grinder 602 are moved by the automatic transfer unit 400 such that the collet 142 is placed over the collet cleaner 500 and, at the same time, the heat plate 102 is placed under the heat plate grinder 602. Then, the collet 142 and the heat plate 102 are sequentially or simultaneously cleaned.

To clean the collet 142, the collet 142 contacts the cleaning apparatus 504, for example, a brush, attached on a body 502 of the collet cleaner 500. Here, the automatic transfer unit 400 is connected to the cleaning unit 600 and the collet cleaner 500 by connecting member 402. Next, the collet cleaner 500 is horizontally moved to remove residues remaining on a lower end surface of the collet 142.

Figure 9A:
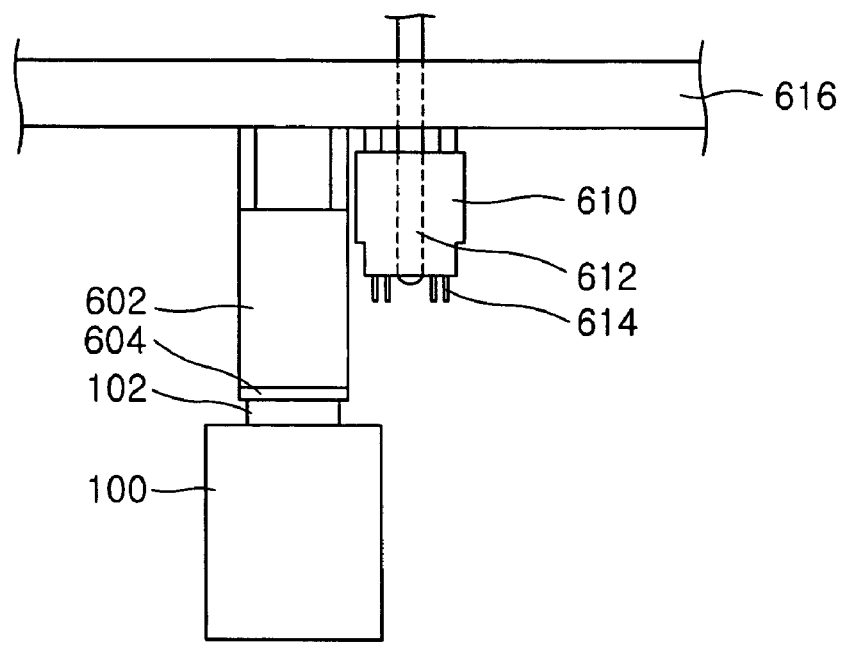
FIGS. 9A and 9B are schematic cross-sectional views illustrating a method of cleaning a heat plate according to an embodiment of the present invention.
Figure 9B:
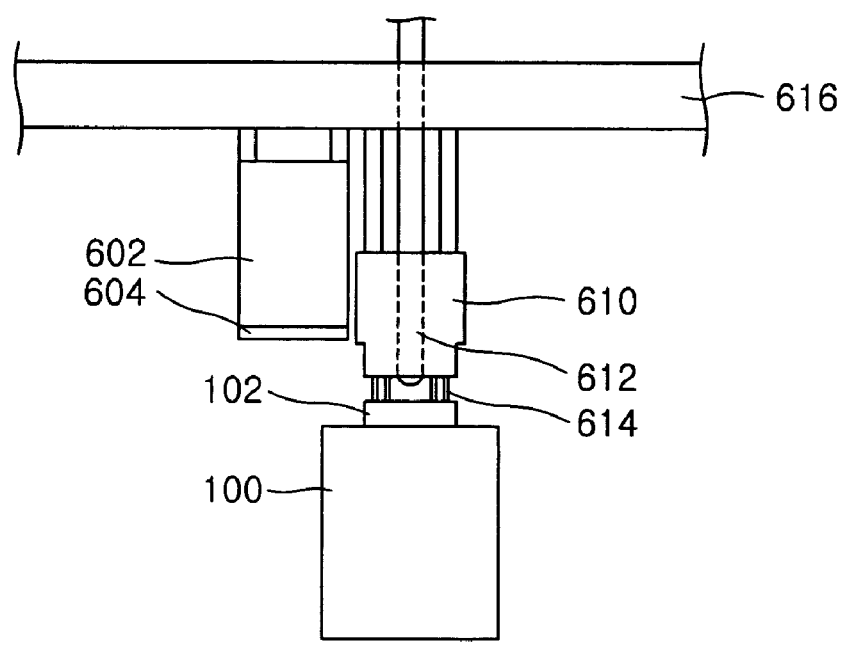

Referring to FIGS. 9A and 9B, to clean the heat plate 102, the heat plate grinder 602 is moved by the cylinder 620 to contact the top surface of the heat plate 102. Thereafter, the heat plate grinder 602 is horizontally moved by the automatic transfer unit 400 to grind the heat plate 102. The heat plate cleaner 610 is moved by the automatic transfer unit 400 to be placed over the heat plate 102. Residues remaining on the heat plate 102 are removed by cleaning apparatus 614, such as a brush, and are outwardly discharged through the air flow passage inside the heat plate cleaner 610 under vacuum conditions.

The cleaning system according to the present embodiment can simultaneously clean the collet and the heat plate, thereby minimizing cleaning time. Further, the heat plate can be substantially cleaned using the grinding apparatus, such as the grinding wheel. Accordingly, the cleaning system according to the present invention can achieve a remarkably improved cleaning effect as compared with the conventional cleaning system.

According to the die attaching apparatus of the present invention, only the collet needs to be replaced with new ones suitable for various packages, thereby minimizing replacement time and costs. Moreover, collets having various shapes can be manufactured according to the kinds of packages almost without limitation.

According to the cleaning system and method of the present invention, the collet and the heat plate can be simultaneously cleaned, thereby minimizing cleaning time and costs. In addition, the heat plate can be perfectly cleaned using the grinding means, such as the grinding wheel, thereby considerably improving cleaning effect.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A die attaching apparatus comprising:
   a press unit for generating a pressure to attach a plurality of dies to a substrate;
   at least one attaching unit disposed under the press unit and transferring the pressure in a substantially downward direction;
   a die pressing member detachably attached to a lower end of the attaching unit for applying the pressure to the dies; and
   a heater disposed adjacent to the attaching unit for heating the die pressing member, wherein a hole passing through the heater has a diameter large enough to accommodate a package of the largest size for performing a die attaching process.

2. The die attaching apparatus of claim 1, wherein the press unit comprises an upper press, which receives an external pressure, and a lower press, which transfers the pressure to the attaching unit.

3. The die attaching apparatus of claim 2, further comprising a load cell and a spring disposed between the upper press and the lower press such that the load cell measures the pressure applied to the dies and the spring provides a force for controlling the pressure applied to the dies.

4. The die attaching apparatus of claim 3, wherein the spring and the lower press are fixed by a floating joint that absorbs the vibration of the spring relative to a central axis of the die attaching apparatus.

5. The die attaching apparatus of claim 1, further comprising a member for limiting the rotation of the attaching unit.

6. The die attaching apparatus of claim 1, further comprising a bushing fitted around the attaching unit.

7. The die attaching apparatus of claim 1, further comprising a guide block joined to the press unit for guiding the movement of the attaching unit.

8. The die attaching apparatus of claim 1, further comprising a heat-insulating block attached onto the heater and preventing heat generated by the heater from being transferred upward.

9. The die attaching apparatus of claim 1, further including a die pressing member supporting member for attaching the die pressing member to the attaching unit.

10. The die attaching apparatus of claim 9, wherein the die pressing member is affixed to a side wall of the die pressing member supporting member.

11. The die attaching apparatus of claim 1, wherein the die pressing member has at least one projection protruding therefrom toward the dies.

12. The die attaching apparatus of claim 11, wherein the projection is configured to cover the plurality of dies.

13. The die attaching apparatus of claim 1, wherein the die pressing member is made of high conductivity material.

14. The die attaching apparatus of claim 1, further comprising an automatic transfer unit disposed over the press unit for horizontally moving the die attaching apparatus.

* * * * *